United States Patent [19]
Leroux et al.

[11] Patent Number: 5,830,610
[45] Date of Patent: Nov. 3, 1998

[54] METHOD FOR MEASURING ALIGNMENT ACCURACY IN A STEP AND REPEAT SYSTEM UTILIZING DIFFERENT INTERVALS

[75] Inventors: Pierre Leroux; David Ziger, both of San Antonio, Tex.

[73] Assignee: VLSI Technology, Inc., San Jose, Calif.

[21] Appl. No.: 729,963

[22] Filed: Oct. 15, 1996

[51] Int. Cl.⁶ ........................................................ G03F 9/00
[52] U.S. Cl. ............................ 430/22; 356/399; 356/401; 382/145; 382/151
[58] Field of Search ............................... 430/22; 356/399, 356/401; 382/145, 151

Primary Examiner—Christopher G. Young
Attorney, Agent, or Firm—Flehr Hohbach Test Albritton & Herbert LLP

[57] ABSTRACT

A method for measuring alignment accuracy in a step and repeat system which includes projecting an array of rows and columns of grating features onto a wafer coated with a resist using a first stepping distance and using an increased exposure dosage from row to row of said array; projecting the same array over the first but using a different stepping distance along the rows and also a sufficient offset in the starting positions of the first and second exposures to form a phase difference between the two projection exposures which will result in a complementary alignment of the two exposures at least one column in the array.

28 Claims, 7 Drawing Sheets

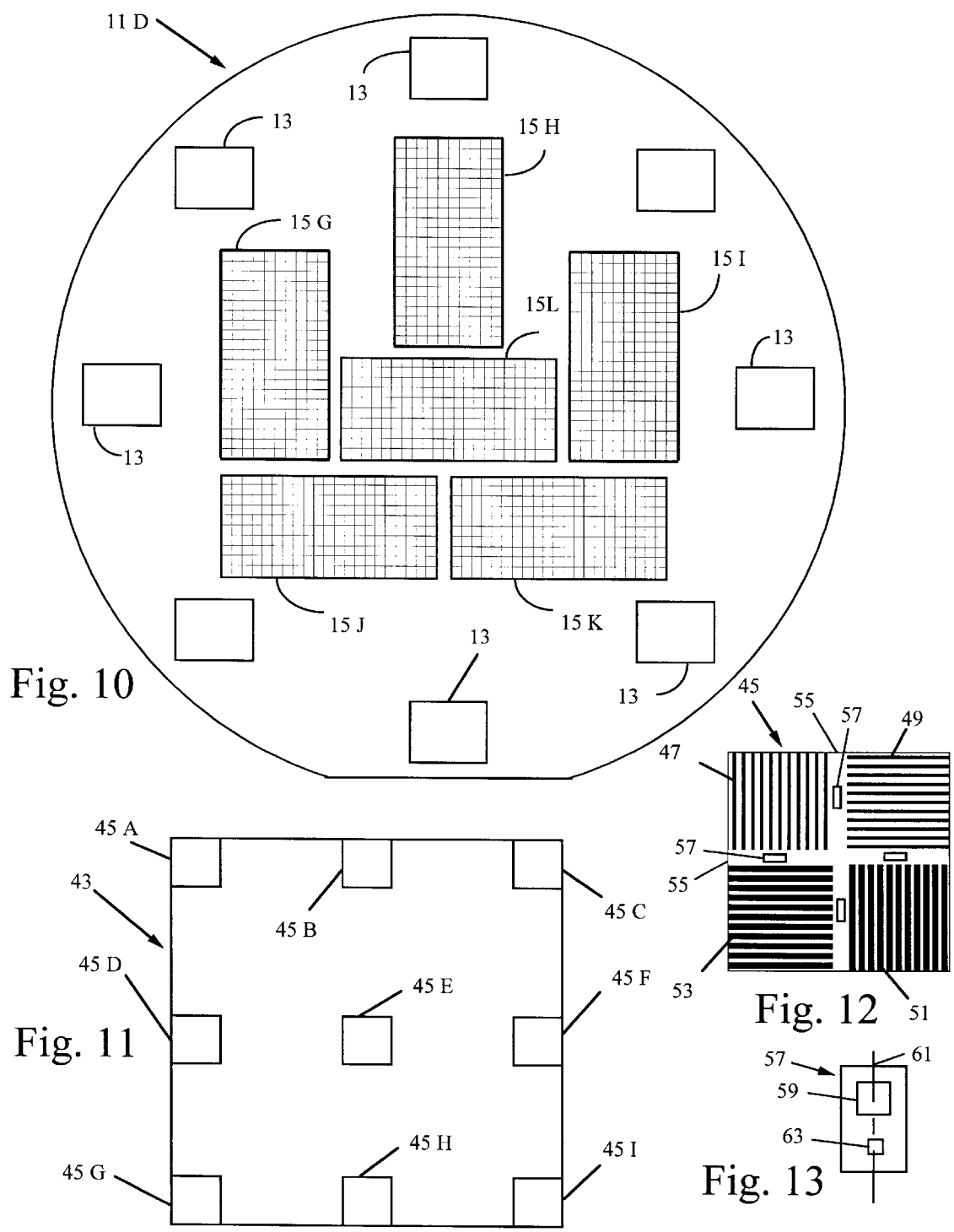

METHOD FOR MEASURING ALIGNMENT ACCURACY IN A STEP AND REPEAT SYSTEM UTILIZING DIFFERENT INTERVALS

This invention relates generally to the field of fabricating integrated circuits and more particularly to maintaining accuracy in the fabrication of such circuits using the step and repeat system for projecting a single lithographic object image onto a wafer many times to create an array or matrix of such objects on the wafer.

BACKGROUND OF THE INVENTION

In the manufacture of most integrated circuits, particularly very large scale integrated circuits such as arrays of DRAM's (dynamic random access memory) or PROM's (programmable read only memory), numerous identical circuits are placed on the same wafer of semiconductor material. This is accomplished by creating various elements of the circuits in multiple layers. Each element is ordinarily produced by a lithographic process wherein an image of one or a few of the individual circuit elements is projected onto the wafer at a time with the wafer being secured to a movable stage. After the first projection is made, the stage is stepped to a new position where the same image is projected again. The process is repeated until all the desired elements of that particular layer are imprinted on the wafer. That layer is then treated to form the desired elements and then subsequent layers of elements are added over the first until all of the elements of the circuit are produced. While forming some of the layers, holes or vias are formed and filled with an electrically conductive material to interconnect the elements of different layers. In creating the various layers, the same step and repeat process is employed so that elements at the various levels can be properly aligned for such interconnections.

Because of the high circuit density on the wafer and the need to make connections to the circuits, it is extremely important that each element image be positioned precisely. Consequently, it is necessary for the stage, which moves the wafer under the projector, to step very accurately from position to position. This is recognized as particularly important when it is realized that, in order to produce an operative memory array or the like, each individual semiconductor structure includes several successive levels of lithography with the elements of each level requiring precise connections to other elements at different levels.

Accordingly, in stepper systems, the stages are monitored frequently for precise and reproducible stage movement and placement. In particular, the horizontal ("x") and vertical ("y") base positions, known as x and y offsets, and the rotation of the stage are all measured and adjusted at regular monthly, weekly or even daily intervals. Also, the intra field magnification of the projector lens requires regular monitoring. Collectively, these are called "alignment corrections" and modem steppers require that the alignment be maintained within a few hundredths of a micrometer.

There are many ways to measure the alignment corrections, the most common being to measure the centering of a box inscribed into a larger second box, generally known as "box in a box." This method normally requires a metrology instrument and multiple measurements. Metrology instruments are expensive and time consuming in use and are subject to various errors. A second method is to measure with alignment verniers. The vernier method is also very time consuming and subject to multiple errors such as the precision of the vernier itself and operator error.

BRIEF SUMMARY OF THE INVENTION

In accordance with the invention the method of measuring alignment utilizes neither a metrology instrument nor any alignment verniers. Rather, an alignment monitor is prepared in the form of a wafer. A photoresist is coated on the wafer and the wafer is mounted on the stage of the stepper in question. The photoresist is first exposed to a pattern of registration marks that the stepper can align to and then to a first exposure of a matrix of line and space features or some other grating such as a matrix of squares. These gratings form a matrix of rows and columns using the regular stepping interval. Preferably, the wafer is then developed in such a way that only the alignment marks are developed leaving the gratings undeveloped. This may be accomplished by locating the alignment marks near the outside of the wafer and developing only the outside portion using an off-axis developer nozzle configuration.

To measure the ability of the stepper to properly align to the original alignment marks and to step accurately, the stepper is realigned to the original starting point and then a second exposure of the matrix is made over the first. The second matrix includes the same line and space features of the original, but has a different step and repeat distance perpendicular to the grating direction, that is, along the rows. Also, the starting position of the second matrix is offset from the first in a direction perpendicular to the grating by one half of the grating pitch at the center column. Consequently, the second exposed matrix has intentional incremental misalignments compared to the first with the misalignment being complete (complimentary alignment) at the center column. With the different stepping distance, the misalignment caused by the offset is incrementally changed as the exposures are made farther away from the center column. At the center column, if there is perfect alignment and stepping accuracy, the misalignment will be total (complementary alignment). Because the same grating is used to expose both matrices, resist will be completely exposed in those sites at which the first and second exposures are complimentary, provided that the illumination dosage is at least sufficient to image the line and space pattern. Those completely exposed matrix elements will be cleared of resist during development.

During the stepping operations for both exposures of the matrix, the exposure dosage is constant along individual lines of intentional misalignment—the horizontal, or x axis, if the horizontal alignment is being monitored. However, the dosage is varied for each such horizontal line. In the embodiment described herein, the variation is such that the upper most line receives maximum exposure and the lower most line the minimum exposure. Ideally, the maximum exposure is sufficiently high that, due to overexposure, not only the resist in alignment with the windows of the masks are fully degraded, but also the resist between windows is substantially degraded as well. Thus, when the resist is developed, the rows subjected to the maximum exposure dosage will be almost totally devoid of any resist whatsoever in most of the columns. On the other hand, the minimum exposure dosage for the lowermost line is sufficiently weak that the resist is not totally degraded even when subjected to exposure for both the first and second matrices. Consequently, at one of the intermediate horizontal lines the dosage of exposure will be, or will approximate be just sufficient to replicate the line and space features of the grating.

After both matrices have been exposed onto the wafer, the wafer is then fully developed and visually inspected. From such visual inspection, not only can it be determined that the stepper is or is not properly aligned, but also the degree of any misalignment can also be determined.

Considering first the particular horizontal line in which the exposure dosage is just large enough to exactly replicate the line and space features of the grating (the ideal exposure line), the element with complimentary alignment will be completely exposed by the two exposures. After development it will be completely cleared of resist. Because the complimentary alignment has been set to occur after a sufficient number of steps to reach the center column, it will be the center element of that line which is cleared of resist if the stepper is in horizontal alignment. However, for those elements without complimentary alignment (i.e. those in which the first and second exposures are either in complete alignment or misaligned by anything other than exactly half of the grating pitch) there will be unexposed resist remaining after development.

In the lines above the ideal exposure line, the increasing dosages, in addition to the decreasing misalignment, create more and more likelihood of totally exposing the line and space pattern both before and after the complimentary alignment of the two exposures. Consequently, a generally "V" shaped pattern of fully exposed elements is developed with the vertex of the "V" being at the center of the matrix.

If the stepper is not in horizontal alignment, its steps from one edge of the matrix toward the center during the second exposure will result in a cumulative movement different from that required for the two matrices to be in complimentary alignment at the center column. Consequently, the center column of the matrix, again considering the horizontal line with an exposure dosage just large enough to replicate the line and space features, will not be the cleared column after development. The cleared column will be to the left or right of center. Again, the cleared column will form the vertex of the "V" but it will be displaced from the center by a number of columns indicative of the degree of misalignment.

BRIEF DESCRIPTION OF THE DRAWING

Additional objects and features of the invention will be more readily apparent from the following detailed description and the pending claims when taken in conjunction with the drawings, in which:

FIGS. 4-1 through 4-21 are schematic cross-sectional views showing the combined exposed areas of the resist forming two lines and spaces of the gratings of the exposure matrix of FIG. 1 after the first and second exposures; the individual Figures showing such combined exposed areas for each step along a single horizontal line of the matrix;

FIG. 5 is an enlarged schematic plan view of the exposure matrix shown in FIG. 1 showing the pattern of exposed and unexposed areas after the first and second exposures of the matrix when the stepper is in horizontal alignment;

FIG. 6 is a view similar to FIG. 5, but showing such a pattern when the stepper is shown to be out of horizontal alignment;

FIG. 7 is a view similar to FIG. 1 but with an arrangement for measuring vertical misalignment in accordance with the invention;

FIG. 8 is a view similar to FIG. 1 but with an arrangement for measuring rotational misalignment in accordance with the invention;

FIG. 9 is a view similar to FIG. 1 but with an arrangement for measuring differences in intra field magnification in accordance with the invention;

FIG. 10 is another view similar to FIG. 1 but with an arrangement for measuring multiple alignment parameters of a single wafer;

FIG. 11 is a schematic plan view of an evaluation mask having a number of grating patterns thereon which may be used to prepare the wafer shown in FIG. 10;

FIG. 12 is an enlarged schematic view showing one of the grating patterns of FIG. 11 including "box in a box" features; and FIG. 13 is a further enlarged schematic view showing one of the "box in a box" features in the grating pattern of FIG. 11.

DESCRIPTION OF THE PREFERRED EMBODIMENTS

Figure 1:
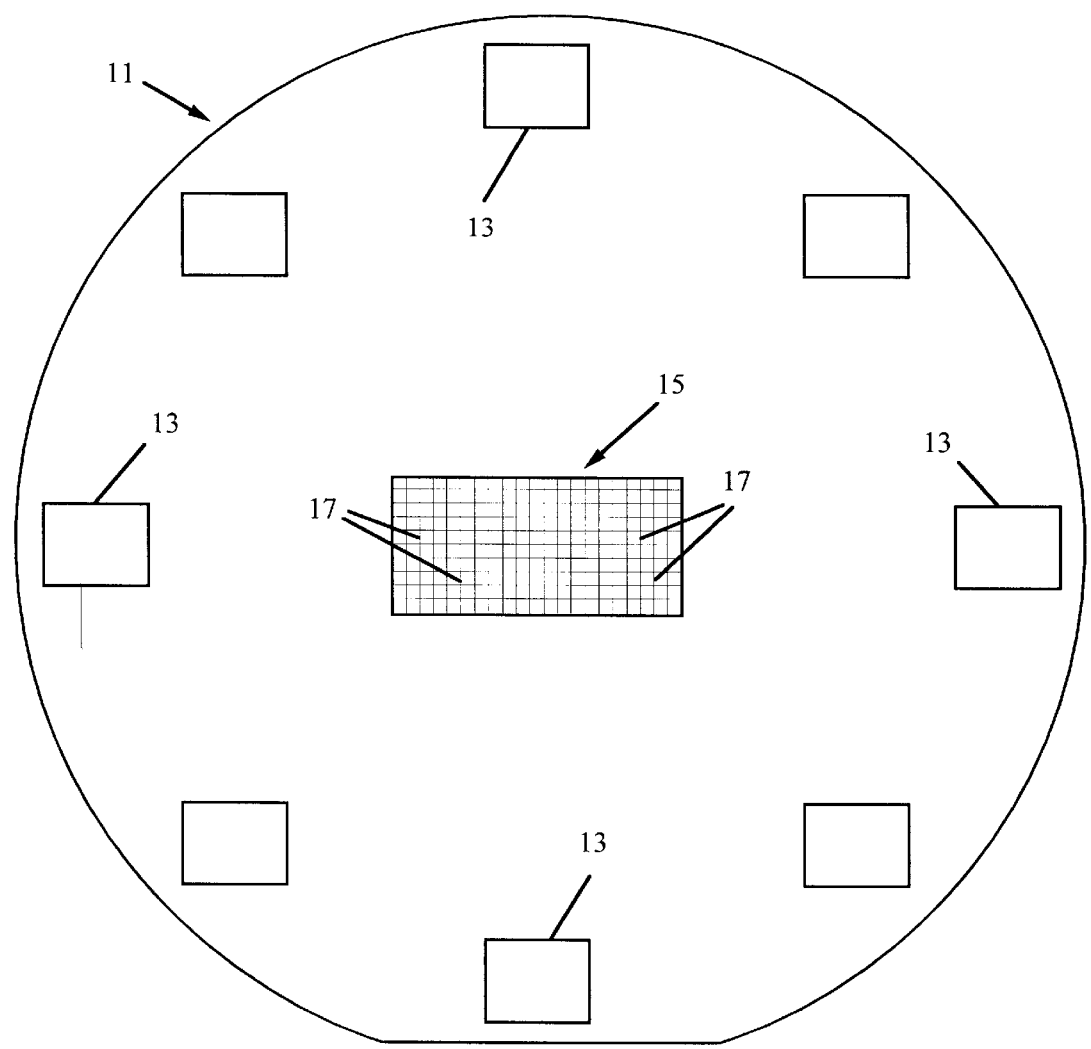
FIG. 1 is a plan view of a semiconductor wafer including a plurality of registration marks and a central exposure matrix of gratings for measuring horizontal misalignment of a stepper in accordance with the invention.

Referring to FIG. 1, there is shown a semiconductor wafer 11 which is coated with a photoresist. The coated wafer is exposed to a pattern including registration marks 13 to which the stepper can align together with a first exposure of a matrix 15. In the embodiment described herein, the matrix 15 includes a series of grating patterns 17 each of which is 2 mm by 2 mm square, and includes twenty-one (21) such patterns in each horizontal row and ten (10) patterns in each vertical column. The exposure of the matrix is accomplished using a mask corresponding to the desired grating pattern; referencing the stage to the center of the wafer and stepping the stage to a starting position where a grating pattern 17 in the first column is exposed. The stage is then sequentially stepped horizontally by 2 mm per step with additional exposures at each step. After completing each row of grating patterns the stage is stepped vertically by 2 mm to additional rows to complete the process for the entire matrix.

When the uppermost row of the matrix is being exposed a maximum dosage of illumination is used and that dosage is decreased at each of the lower rows. In the instant embodiment, the exposure at the uppermost row was for 310 msec and the dosage was decreased by 20 msec at each lower row.

Figure 2:
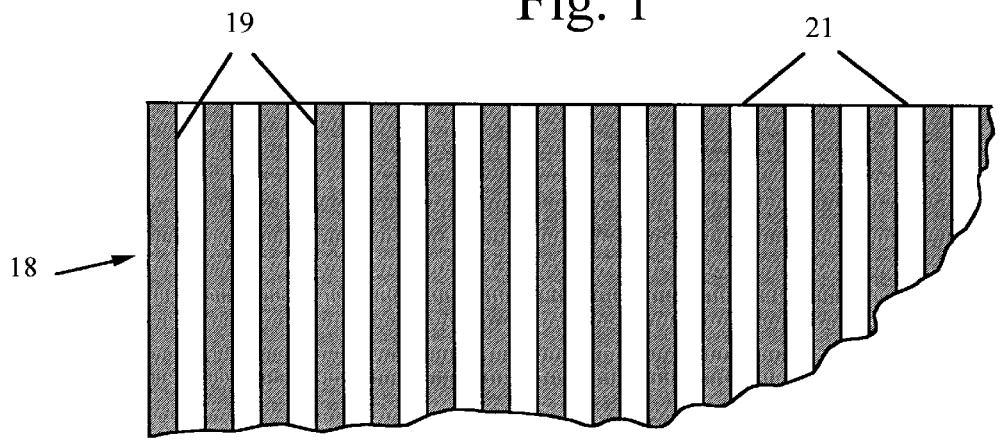
FIG. 2 is a partial plan view of a mask for producing line and space features of each individual grating in the exposure matrix.

Referring to FIG. 2, an enlarged view of a portion of a mask 18 for the grating patterns 17 is shown wherein the mask comprises a series of vertical opaque lines 19 extending from the top to the bottom of each of the 2 mm by 2 mm patterns separated by transparent spaces 21. In the embodiment described, the width of each line 19 is 0.6 $\mu$m. Likewise, the space 21 between each of the lines is also 0.6 $\mu$m providing a 1.2 $\mu$m pitch.

After the wafer is exposed to the alignment marks 13 and a first exposure of the matrix 15 it is then developed in such a way that only the alignment marks 13 are developed thereby leaving the exposed resist of the matrix 15 undeveloped. One way to accomplish this is to locate the alignment marks near the outside of the wafer as shown and develop only the outside portion using an off-axis developer nozzle configuration.

After the alignment marks 13 have been developed, a second exposure of the matrix 15 is made over the first. The second exposure of the matrix, however, is offset from the first exposure and has a different step and repeat distance perpendicular to the grating direction. To perform the second exposure the stage, referenced to the center of the matrix, is horizontally offset by a distance equivalent to one half of the grating pitch. In the instance of the embodiment described, the grating pitch being 1.2 $\mu$m, the stage is offset by 0.6 $\mu$m in the horizontal direction. In addition, the horizontal stepping distance is changed by 0.02 $\mu$m from the 2.00000 mm per step used in the first exposure to 1.99998 mm. The stage is then moved to its starting position at the first column of the matrix and the entire matrix is again exposed using the same exposure dosages as in the first exposure.

Figure 3:
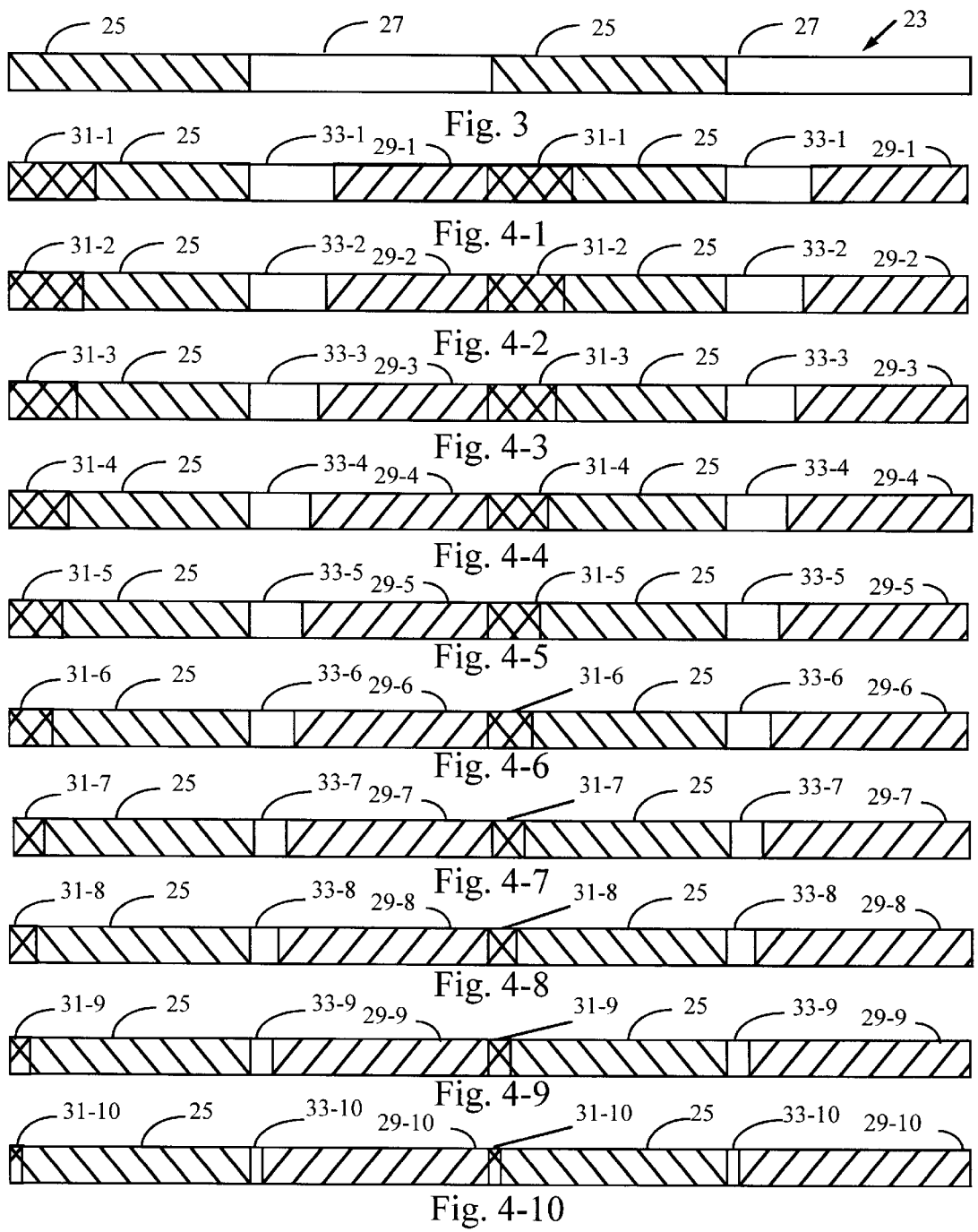
FIG. 3 is a schematic cross-sectional view showing exposed areas of the resist forming two of the lines and spaces of the gratings of the exposure matrix of FIG. 1 after the first exposure in accordance with the invention.

The effect of the two separate exposures of the matrix on the wafer 11 can best be shown upon a review of FIGS. 3 and 4-1 through 4-21. FIG. 3 is a cross sectional view of a portion of the resist overlying the wafer 11 after the first exposure in accordance with the invention. Specifically, FIG. 3 shows a portion of that row of the matrix having the exposure dose required to yield equal lines and spaces. The showing of FIG. 3 is common to all of the columns 1 through 21 after the first exposure. The exposed portions of the resist 25, of course, underlie the spaces 21 of the mask 18 of FIG. 2 and the unexposed portions 27 underlie the line portions 19 of the mask. After the first exposure, therefore, the equal width, line and space pattern of the grating is transferred to the resist 23 as shown at FIG. 3.

FIGS. 4-1 through 4-21 are views similar to FIG. 3 showing the row having the exposure dosage required to yield equal lines and spaces. However, FIGS. 4-1 through 4-21 show the portions of the resist subjected to both the first and second exposures for each of the columns of the matrix, columns 1 through 21, respectively. Moreover, FIGS. 4-1 through 4-21 show the resultant exposure of the resist in a situation where there is perfect horizontal alignment of the stepper.

Figure 4:
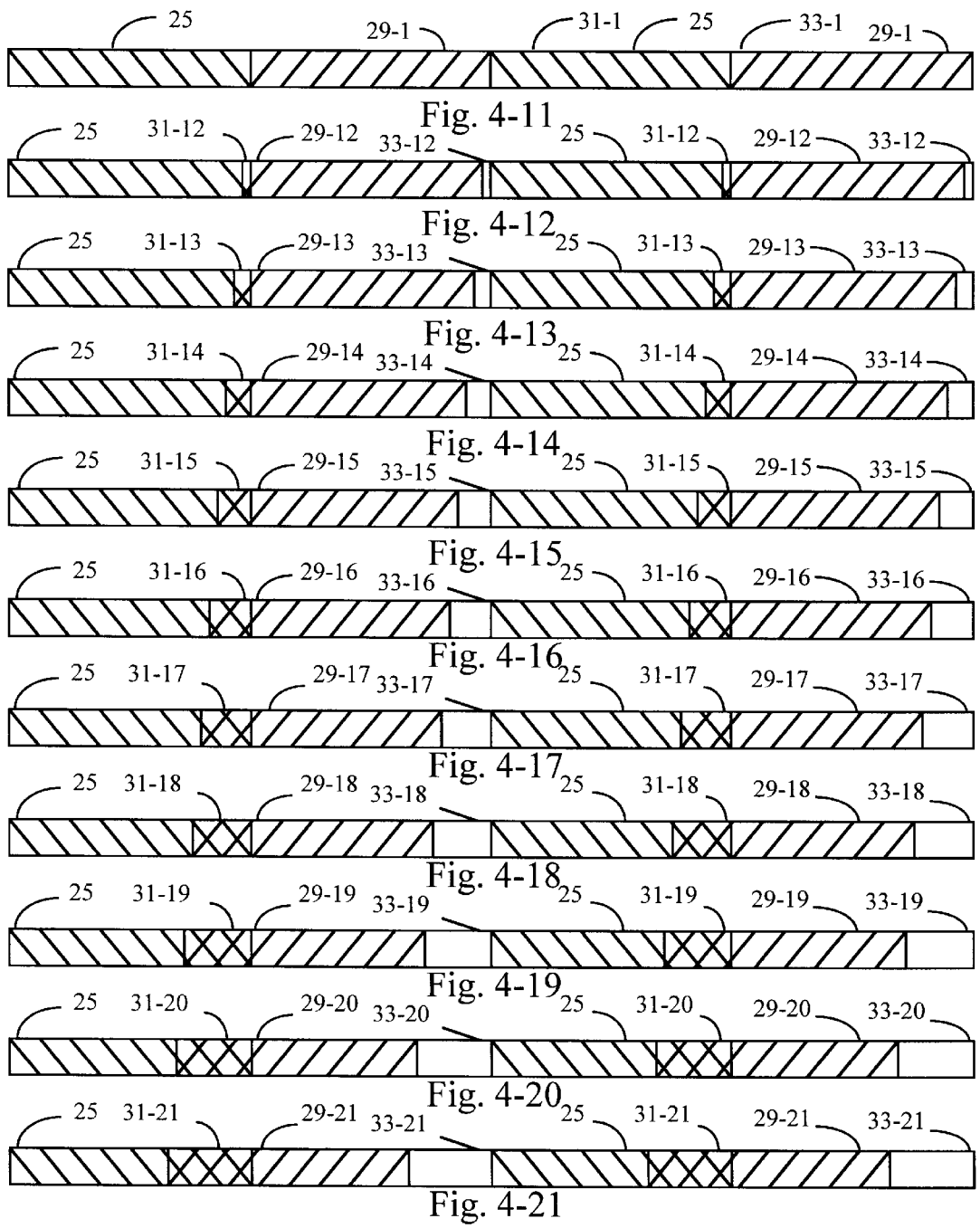

In FIGS. 4-1 through 4-21, the resist is shown with the exposed portions 25 from their first exposure and it should be noted that the portions 25 are in the same relative position in each of the FIGS. 4-1 through 4-21. The portions of the resist exposed during the second exposure are shown in FIG. 4 as portions 29-x (i.e., 29-1 through 29-21) for each of the columns 1 through 21 respectively. These portions 29-x have relatively different positions in the individual figures with maximum overlap of portions 25 in FIG. 4-1 (column 1, the far left column of the matrix); to complementary alignment with portions 25 in FIG. 4-11 (column 11, the center column of the matrix); to maximum overlap again in FIG. 4-21 (column 21, the far right column of the matrix).

Referring specifically to FIG. 4-11, there are shown the portions 25, exposed in the first exposure, and also the portions 29-11 which were exposed in the second exposure. The two sets of exposures combine to expose the entire surface of the resist. It is also seen that, looking at FIG. 4-12 showing the twelfth column immediately adjacent to the center column 11, there are slight overlaps 31-12 of the exposures 25 and 29-12 and corresponding unexposed areas 33-12.

As can be seen in FIGS. 4-1 through 4-21 in their totality, there are relatively large areas 33-1 of non-exposed resist at the first column as shown in FIG. 4-1. As the stepper proceeds from column to column, with each step being 0.02 $\mu$m shorter than the steps which produce the exposed areas 25, the non-exposed areas become smaller and smaller until they are totally eliminated at the eleventh column as shown in FIG. 4-11. In stepping beyond the eleventh column, aggain small non-exposed areas appears in column 12 as shown at 33-12 in FIG. 4-12 and the non-exposed areas increase step by step to the final column 21 as shown at 33-21 in FIG. 4-21.

After stepping through a single row of the matrix, the stepper repeats its operation in a different row but with a different exposure dosage. As set forth above, the higher dosage is used in the uppermost row and the lower dosage in the lowermost row. After the entire matrix is exposed a second time the resist is developed and, in those areas 33-x of the matrix which have not been exposed during either exposure, the resist remains after the development. Since the grating patterns are 2 mm by 2 mm square, the presence of the resist can be visually seen with the naked eye and without the aid of any optical instrument. Indeed, much smaller grating patterns would be visible to the naked eye and, with the use of a microscope, even smaller gratings, with correspondingly increased accuracy, could be seen.

It should be recognized that the exposed areas as shown in FIGS. 3 and 4 are for the particular exposure dosage in which the grating image is exactly replicated on the resist. However, the exposure increases from the bottom row to the top row causing more and more of the resist to be exposed by means of the overexposure. With higher dosages, the first exposure as shown in FIG. 3 would show exposed areas 25 being somewhat larger. Likewise, in the views shown in FIG. 4, if the exposure dosages are higher, not only the exposed areas 25 but also the exposed areas 29 would be larger thereby increasing the size of the overlap areas 31 and, more importantly, decreasing the size of the non-exposed areas 33. Conversely, when the exposure dosage is less than required to provide exact replication of the grating, the exposed areas 25 and 29 will be smaller than is shown in FIGS. 3 and 4 and the non-exposed areas would be larger.

Figure 5:
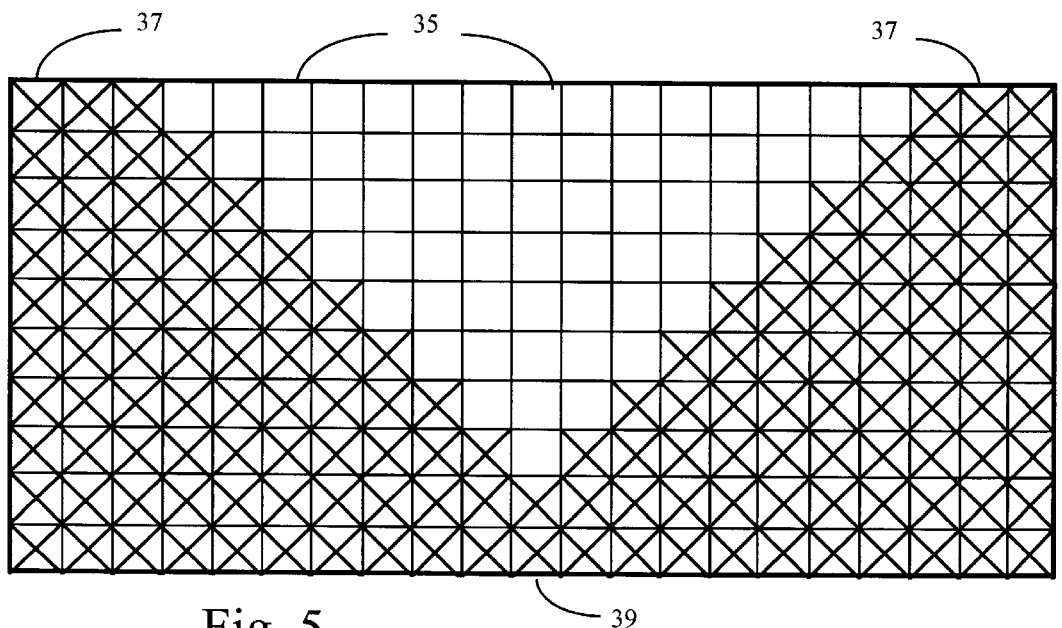

Referring to FIG. 5, the results of the exposure as set forth above are shown for a system in which the stepper is perfectly aligned in the horizontal direction. In FIG. 5 each of the grating elements of the array is shown, those being clear of resist after the final development being shown as open squares 35 and those still having resist being shown by crossed squares 37. In the third row from the bottom there is but a single grating pattern cleared of the resist and that single pattern is in the center column 39. In the lines above the third line, where there is more and more exposure dosage, it is noted that the number of cleared patterns increases as the illumination increases. The steadily increasing number of cleared patterns is centered on the center column 39 and form a generally "V" shaped display. On the other hand, when the dosage is insufficient as in the first and second rows from the bottom none of the cells in the horizontal line are cleared. The entire display is easily visible on the developed wafer with the separations between those patterns still having resist thereon being obvious to the naked eye so that the rows and columns can be easily counted.

Figure 6:
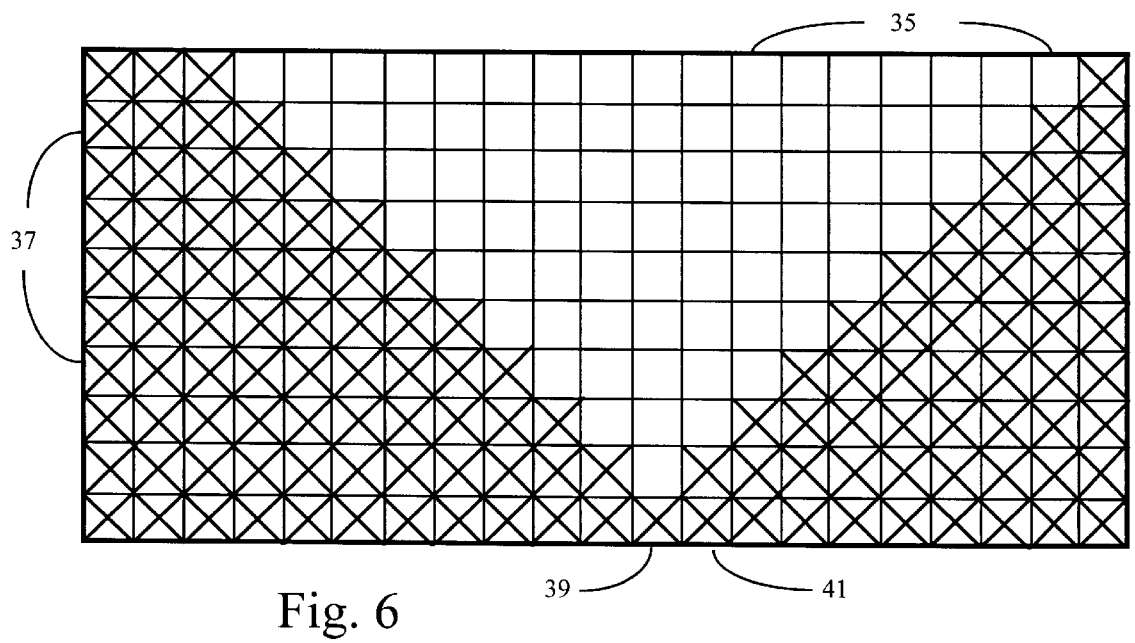

FIG. 6 shows an arrangement similar to that of FIG. 5 but which is the result of an actual test wherein the stepper was not perfectly aligned but rather was slightly misaligned horizontally. It can be seen that the "V" shaped pattern is still evident but its vertex is no longer in the center column 39. Again, the presence and absence of resist can be easily seen with the naked eye and the presence and position of the "V" shaped pattern relative to the center is also clearly visible. In this instance, the twelfth column 41 is at the center of the cleared rows. Recognizing that the difference in the stepping distances for the two matrix exposures is 0.02 μm per step, it is seen that the horizontal direction error in the stepper is 0.02 μm.

In some instances, vertex of the "V" shaped pattern may be somewhat flattened so as to have a width of two or more columns. Such may be the case when the differences in exposure settings between adjacent rows does not permit a row having the precise dosage required to yield equal lines and spaces. In such instances, the center of the "V" can be extrapolated so as to determine the stepper error.

Consequently, without any metrology instrument or alignment vernier device, but only by visual inspection of the developed wafer, the alignment correction error of the stepper in the horizontal direction can be quickly and easily determined.

Figure 7:
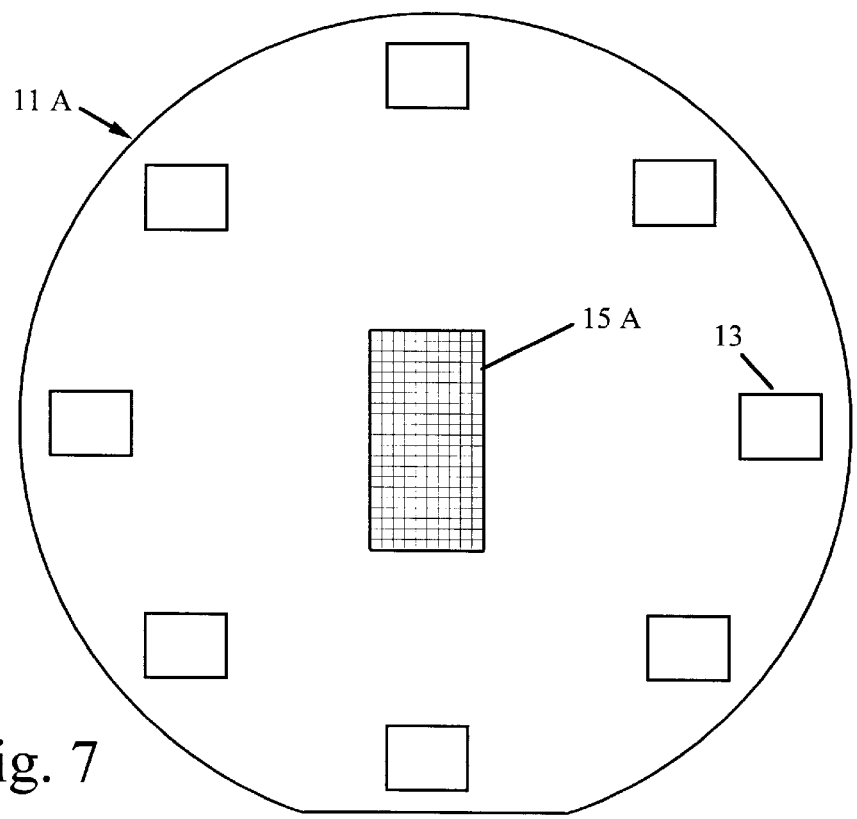
Figure 8:
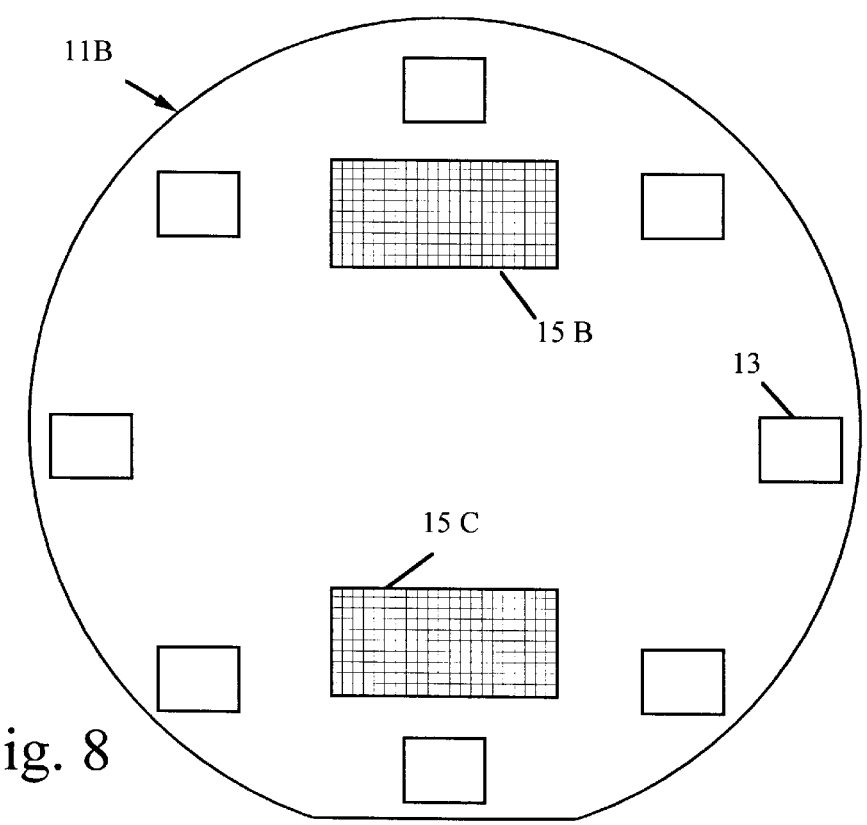
Figure 9:
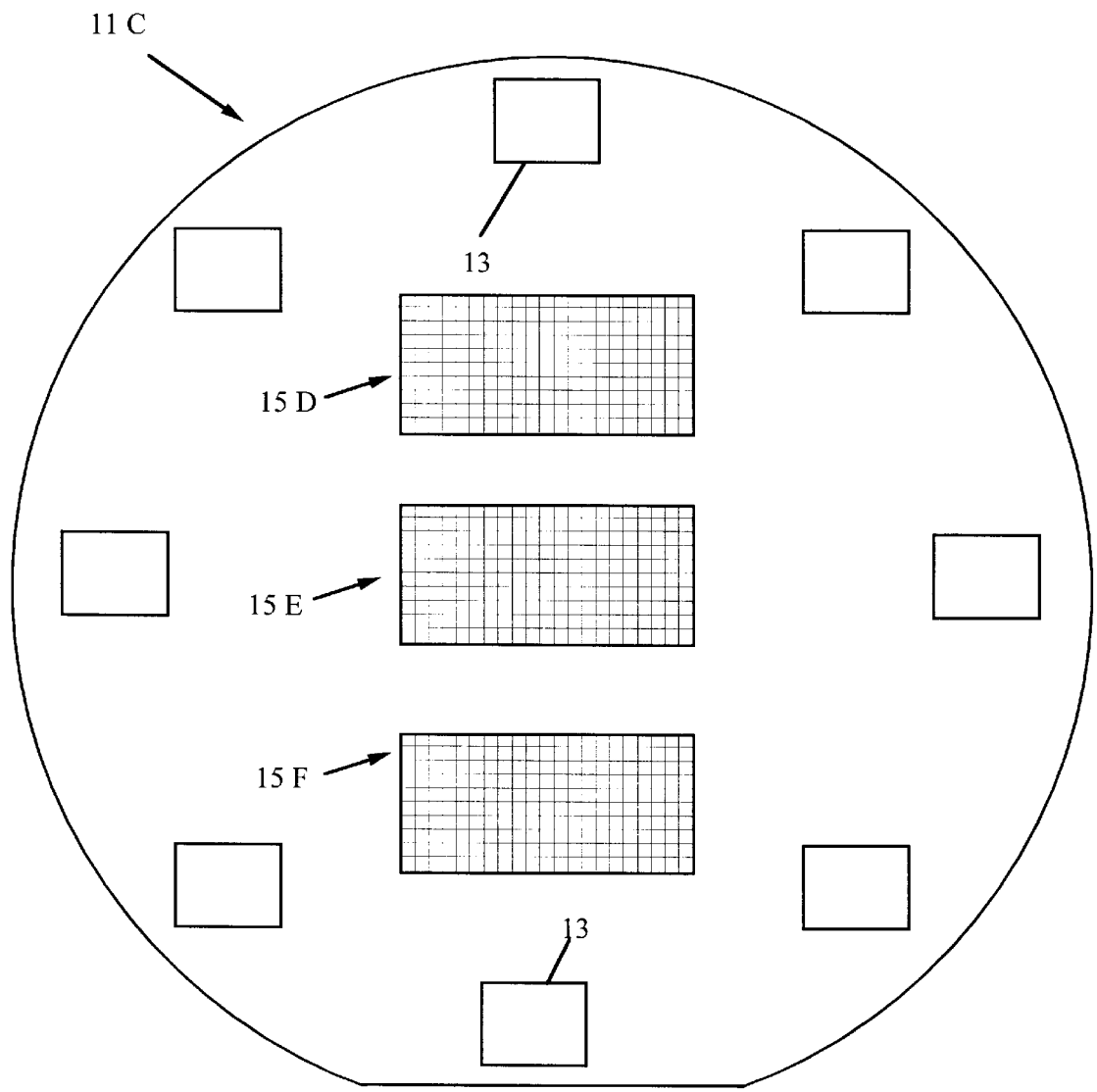

Furthermore other alignment corrections can be determined with arrangements as shown in FIGS. 7–9 similar to that of FIG. 1. Referring specifically to FIG. 7, an alternative embodiment is shown for measuring error in vertical stepping of the stage. Here, the wafer 11A includes the usual alignment marks 13 and a matrix 15A. It will be noted, however, that the matrix 15A is rotated 90° from the orientation shown in FIG. 1 thereby extending vertically rather than horizontally. In this instance, in order to check for the vertical alignment of the stepper, the stepping operation for the second exposure of the matrix is offset by a half pitch in the vertical direction rather than the horizontal direction and likewise the stepper stepping distance is altered in the vertical direction rather than in the horizontal. The same results can be obtained with a "V" shaped pattern being displaced in the vertical direction with various mis-alignments as opposed to the horizontal.

In FIG. 8 there is still another version of the invention as shown wherein the rotational error of the stage can be determined. In this instance wafer 11B is shown again having alignment marks 13, but two matrixes 15B and 15C separated vertically from each other are provided. If there is no rotational misalignment, when the final exposure is made, both of the matrices will be developed to show a pattern as set forth in FIG. 4 above. On the other hand, if there is a rotational error, it will be shown by the "V" shaped pattern, depending upon the direction of the rotational error, being to the right of center in one of the matrices 15B or 15C and to the left of the center in the other. Again, the distance of the two "V" shaped patterns from their respective center columns, together with a measure of the distance between the two matrices, provides a measure of the actual rotational misalignment.

Referring to FIG. 9, a still further variation can be seen in a wafer 11C showing a form of the invention to measure the accuracy of intra field magnification of the stepper lens. The stepper lens magnification error can be checked by overlying various parts of the lens to a reference matrix printed with the center of the lens field. Again, the wafer includes alignment marks 13, and further includes a reference matrix 15D. For a measure of the magnification accuracy at one or several positions of the lens, one or more additional matrices may be provided such as the matrices 15E and 15F.

The procedure utilizes a mask which includes one grating pattern to be positioned at the center of the lens together with one or more additional grating patterns identical to the first but displaced therefrom so as to be positioned at one or more various locations away from the center of the lens where the accuracy is to be checked. Using the grating at the center of the lens, a first exposure is made on each matrix. A second exposure is then made on the reference matrix 15D, again using the grating positioned at the center of the lens but using an offset and altered stepping distance just as in the procedure for checking horizontal alignment as described above in conjunction with FIGS. 1 through 4.

A second exposure is then made on the other matrices 15E and 15F but using gratings displaced from the center of the lens. For instance the matrix 15E may be exposed with a grating displaced 10 mm to the left of the lens center and the matrix 15F with a grating displaced 20 mm above the lens center. Each of these second exposures, of course, are made using the offset and altered stepping distance as in the procedure for checking horizontal alignment. After development, the intra field magnification error of the lens can be determined by comparing the position of the vertex of the "V" shaped pattern in the reference matrix 15D with the positions in matrices 15E and 15F. With the offset and altered stepping distance as described with respect to FIGS. 1 through 4, each column of displacement from the reference matrix will show a magnification error of 0.02 μm.

While the various embodiments of the inventions described above have been limited to measuring individual alignment parameters, several such parameters may be measured with a single wafer in conjunction with an evaluation mask. One such wafer 11D is shown in FIG. 10 whereon the usual alignment marks 13 are shown. However, six different matrixes 15G through 15L are shown. With the six matrixes, horizontal and vertical alignment, as well as rotational and intrafield magnification errors, can be determined. An evaluation mask 43, in accordance with the invention, is shown in FIG. 11 typically having dimensions of about 20 mm by 20 mm square and having nine grating patterns 45A through 45I. The nine grating patterns are all alike and are schematically shown in FIG. 12.

Referring specifically to FIG. 12, each grating pattern 45 may typically be about 4 mm by 4 mm square and can be divided into four zones 47, 49, 51 and 53 each being about 2 mm by 2 mm square and separated from each other by margins 55 of about 100 μm. Two of the zones 47 and 49 are formed with a grating pattern having lines and spaces of 0.4 μm wide while the remaining two zones 51 an 53 are formed with gratings having a 0.6 μm wide line and space features. Thus, the same evaluation mask can be used for measuring alignment with different degrees of precision. The narrower line and space features provide more precision but also are more time consuming and slightly more difficult to read without the aid of a microscope. Other line and space widths may also be employed. In addition, two of the zones, 47 and 51, provide a series of vertical lines and spaces such as that of FIG. 2. The zone 51, with line and space widths of 0.6 μm, is identical to the grating pattern of FIG. 2. The zones 49 and 53 provide a series of horizontal lines with which vertical stepping alignment can be measured. Referring again to FIG. 11, using all nine of the grating patterns, 45A through 45I, provides the ability to take measurements over a wide spectrum of the lens and to obtain not only magnification errors at various locations but also an overall average of mis-alignment throughout the fill dimension of the evaluation mask 43.

In using the wafer 11D and the evaluation mask 43 to make multiple alignment measurements, the matrix 15F may be used in the same manner as the matrix 15 of FIG. 1 to measure the horizontal stepping accuracy. Likewise, the matrix 15H can be used in the same manner as the matrix 15A of FIG. 7 to measure the vertical stepping accuracy. In both instances, the center grating pattern 45E on the evaluation mask 43 should be employed for maximum accuracy. To measure the horizontal stepping accuracy, the zone 47 or 51 of the pattern 45, may be used depending upon the degree of accuracy required.

To measure rotational accuracy, the matrixes 15G and 15I may be used with the zone 49 or 53 of the grating pattern 45E for the exposures of both matrixes. However, while the second exposure may also be made with the grating pattern 45E, a better determination of the overall rotational accuracy can be obtained by using the pattern 45D for the second exposure of one of the matrixes and 45F for the second exposure of the other.

The matrixes 15J and 15K may be used to measure the field of view magnification. Again, the first exposure for both matrixes is ideally made from the zone 47 or 51 of the pattern 45E. The second exposure should be made for the same zone but from the patterns 45D and 45F.

In procedure, the alignment marks 13 and the first exposure of all the matrixes 15G through 15L may be made as a first step. The alignment marks are then developed and the second exposures can be made in any desired order. After all the second exposures are accomplished, the entire wafer is developed and the various matrixes can be read in the same manner as with the individual measurements set forth above.

In addition, the evaluation mask 43 may also be used for calibration of a metrology tool. To this end, the pattern 45 may further include the usual large and small squares used to perform the "box in a box" measurement. The two squares, when imprinted in the matrix 15, produces a "box in a box" configuration adjacent each grating pattern 17 (FIG. 1).

The two square features 57, shown generally in FIG. 12 and in more detail in FIG. 13, may be positioned in the margins 55 of the pattern 45 and may be imprinted on any of the various matrixes 15 along with the grating pattern 17 (FIG. 1). As seen in FIG. 13, the two square feature 45 includes a large square 59 centered on a line 61 and a smaller square 63 somewhat offset from the centerline 61. For the pattern of zones 47 and 49, the amount of the offset should be 0.4 μm, the same as the widths of the space and line features of the pattern. On the other hand, the offset for the patterns 51 and 53 should be 0.6 μm in the example given. The box in a box configuration, being of such small size, is not adequately visible with the unaided eye but is, of course, visible with the aid of a microscope.

Many other variations of the method are within the scope of the invention. For instance, it may not always be necessary to actually develop the alignment marks or even the matrixes. With some types of resist, the mere exposure to illumination provides sufficient visual change that subsequent alignment and reading the "V" shaped patterns can be accomplished. Moreover, it is possible that even if the alignment marks are to be developed, they may be developed along with the first exposed matrix recognizing, of course, that such an exposure will provide a topography on the resist which may lessen the overall accuracy of the system. Moreover, it should be recognized that more than one of the alignment corrections may be accomplished on the same wafer or even with the same matrix.

We claim:

1. A method of measuring alignment corrections in a step and repeat printer comprising:
    a) positioning a wafer coated with a photoresist on the stage of a step and repeat printer at a starting position;
    b) exposing said wafer to a pattern of registration marks;
    c) exposing said wafer a first time to an exposure matrix of gratings repeated over a portion of said wafer in a step and repeat fashion having a first stepping interval;
    d) exposing said wafer a second time to said exposure matrix over said portion of said wafer in a step and repeat fashion with a second stepping interval different from the first stepping interval; and
    f) observing said exposed wafer to determine positions of fully exposed gratings thereon.

2. A method of measuring alignment corrections in a step and repeat printer as defined in claim 1 wherein said gratings are formed of line and space features.

3. A method of measuring alignment corrections in a step and repeat printer as defined in claim 1 together with the step of developing said resist after the step of exposing said wafer to said pattern of registration marks.

4. A method of measuring alignment corrections in a step and repeat printer as defined in claim 3 wherein said step of developing said resist is after the step of exposing said wafer a first time to said exposure matrix.

5. A method of measuring alignment corrections in a step and repeat printer as defined in claim 4 wherein said step of developing said resist comprises developing said registration marks only.

6. A method of measuring alignment corrections in a step and repeat printer as defined in claim 4 wherein said step of developing said resist is after the step of exposing said wafer a second time to said exposure matrix.

7. A method of measuring alignment corrections in a step and repeat printer as defined in claim 1 wherein said step of observing said wafer comprises visually observing said wafer.

8. A method of measuring alignment corrections in a step and repeat printer as defined in claim 1 together with the step of offsetting said stage by a distance of one half the pitch of said grating in the direction perpendicular to the grating after the step of exposing said wafer a first time and before the step of exposing said wafer a second time.

9. A method of measuring alignment corrections in a step and repeat printer comprising:
    a) positioning a wafer coated with a photoresist on the stage of a step and repeat printer at a starting position;
    b) exposing said wafer to a pattern of registration marks;
    c) exposing said wafer to an exposure matrix of gratings repeated over a portion of said wafer in a step and repeat fashion having a first stepping interval to produce a first matrix array on said wafer;
    d) aligning said wafer in said printer to the first exposed matrix;
    e) exposing said wafer a second time to said exposure matrix over said portion of said wafer in a step and repeat fashion with a second stepping interval different from the first stepping interval to form a second matrix array on said wafer; and
    f) observing said exposed wafer to determine positions of fully exposed gratings thereon.

10. A method of measuring alignment corrections in a step and repeat printer as defined in claim 9 wherein said gratings are formed of line and space features.

11. A method of measuring alignment corrections in a step and repeat printer as defined in claim 9 together with the step of developing said resist after the step of exposing said wafer to said pattern of registration marks.

12. A method of measuring alignment corrections in a step and repeat printer as defined in claim 11 wherein said step of developing said resist is after the step of exposing said wafer a first time to said exposure matrix.

13. A method of measuring alignment corrections in a step and repeat printer as defined in claim 12 wherein said step of developing said resist comprises developing said registration marks only.

14. A method of measuring alignment corrections in a step and repeat printer as defined in claim 12 wherein said step of developing said resist is after the step of exposing said wafer a second time to said exposure matrix.

15. A method of measuring alignment corrections in a step and repeat printer as defined in claim 9 wherein said step of observing said wafer comprises visually observing said wafer.

16. A method of measuring alignment corrections in a step and repeat printer as defined in claim 9 together with the step of offsetting said stage by a distance of one half the pitch of said grating in the direction perpendicular to the grating after the step of exposing said wafer a first time and before the step of exposing said wafer a second time.

17. A method of measuring alignment corrections in a step and repeat printer comprising:
   a) positioning a wafer coated with a photoresist on the stage of a step and repeat printer at a starting position;
   b) exposing said wafer to a pattern of registration marks;
   c) exposing said wafer a first time to an exposure matrix of gratings repeated over a portion of said wafer in a step and repeat fashion having a first stepping interval to produce a first matrix array on said wafer;
   d) developing said registration marks;
   e) aligning said wafer in said printer to the first exposed matrix;
   f) exposing said wafer a second time to said exposure matrix over the same portion of said wafer in a step and repeat fashion with a second stepping interval different from the first stepping interval to form a second matrix array on said wafer;
   g) developing said first and second matrix arrays; and
   h) observing said fully developed wafer to determine the presence of photoresist remaining thereon.

18. A method of measuring alignment corrections in a step and repeat printer as defined in claim 17 wherein said gratings are formed of line and space features.

19. A method of measuring alignment corrections in a step and repeat printer as defined in claim 17 wherein said step of observing said wafer comprises visually observing said wafer.

20. A method of measuring alignment corrections in a step and repeat printer as defined in claim 17 together with the step of offsetting said stage by a distance of one half the pitch of said grating in the direction perpendicular to the grating after the step of exposing said wafer a first time and before the step of exposing said wafer a second time.

21. A method of measuring rotational alignment corrections in a step and repeat printer comprising:
   a) positioning a wafer coated with a photoresist on the stage of a step and repeat printer;
   b) exposing said wafer to a pattern of registration marks;
   c) positioning said wafer at a first starting position offset from the center of said wafer in a first direction;
   d) exposing said wafer a first time to an exposure matrix of gratings beginning at said first position and repeated over a first portion of said wafer in a step and repeat fashion having a first stepping interval;
   e) positioning said wafer at a second starting position offset from the center of said wafer in a second direction opposite to said first direction;
   f) exposing said wafer a first time to an exposure matrix of gratings beginning at said second position and repeated over a second portion of said wafer in a step and repeat fashion having said first stepping interval;
   g) exposing said wafer a second time to said exposure matrix beginning at said first position and repeated over said first portion of said wafer in a step and repeat fashion with a second stepping interval different from the first stepping interval;
   h) exposing said wafer a second time to said exposure matrix beginning at said second position and repeated over said second portion of said wafer in a step and repeat fashion with said second stepping interval; and
   i) observing said exposed wafer to determine positions of fully exposed gratings thereon.

22. A method of measuring alignment corrections in a step and repeat printer as defined in claim 21 wherein said gratings are formed of line and space features.

23. A method of measuring alignment corrections in a step and repeat printer as defined in claim 21 together with the step of developing said resist after the step of exposing said wafer to said pattern of registration marks.

24. A method of measuring alignment corrections in a step and repeat printer as defined in claim 23 wherein said step of developing said resist is after the steps of exposing said wafer a first time to said exposure matrix at said first and second starting positions.

25. A method of measuring alignment corrections in a step and repeat printer as defined in claim 24 wherein said step of developing said resist comprises developing said registration marks only.

26. A method of measuring alignment corrections in a step and repeat printer as defined in claim 24 wherein said step of developing said resist is after the step of exposing said wafer a second time to said exposure matrix at said first and second starting positions.

27. A method of measuring alignment corrections in a step and repeat printer as defined in claim 21 wherein said step of observing said wafer comprises visually observing said wafer.

28. A method of measuring alignment corrections in a step and repeat printer as defined in claim 21 together with the step of offsetting said stage by a distance of one half the pitch of said grating in the direction perpendicular to the grating after the steps of exposing said wafer a first time at said first and second starting positions and before the step of exposing said wafer a second time at said first and second starting positions.

* * * * *